Jan. 2 1968 W. M. CORNS 3,362,005

HINGE TYPE CONNECTOR FOR CIRCUIT BOARDS

Original Filed Feb. 3, 1965

INVENTOR.

William M. Corns

BY

Balluff and McKinley

ATTORNEYS.

United States Patent Office 3,362,005

Patented Jan. 2, 1968

3,362,005
HINGE TYPE CONNECTOR FOR CIRCUIT BOARDS

William M. Corns, Ross, Calif., assignor to Berg Electronics, Inc., New Cumberland, Pa., a corporation of Pennsylvania Continuation of application Ser. No. 430,001, Feb. 3, 1965. This application June 26, 1967, Ser. No. 649,049

19 Claims. (Cl. 339—4)

ABSTRACT OF THE DISCLOSURE

This invention relates to connectors for circuit boards and particularly to a hinge type connector for making electrical connections between circuit boards in a computer or similar device.

This is a continuation of application Ser. No. 430,001, filed Feb. 3, 1965, and now abandoned.

In computer assemblies it is necessary to provide electrical connections between the circuitry carried on adjacent circuit boards. Conventionally such connections have been made by hand soldering individual wire leads between the circuit boards. The wires lead from a hole at the edge of one circuit board to a hole at the edge of another circuit board and connect the circuitry of the two boards. It is usual to provide as many as seventy-five of such hand-soldered connections along the edge of a 12-inch computer circuit board.

The conventional hand-soldered circuit board connectors are extremely expensive in terms of the time and labor involved in making the precision connections required to fit and solder the individual pieces of wire between circuit boards. It is almost impossible to utilize the hand-soldered connectors in joining the very small circuit boards which are now used in some circuits. The size of these circuit boards makes the labor cost involved in making hand-soldered connectors prohibitive.

My invention is a pre-assembled flexible hinge connector for circuit boards which is inexpensive to produce by mass production and which is easily and quickly joined to the edges of circuit boards to make electrical connections between the circuits carried by each board. The hinge connector has a flexible strip body of nonconductive material in which are embedded a series of conductors running from one edge of the strip to the other edge of the strip. Contacts held in the strip are secured to the ends of the conductors and project from the strip in a row at each edge of the strip. The connectors are easily joined to the circuit boards by pushing each row of contacts into holes located along the edge of one of the circuit boards. The unit may then be dip soldered to assure positive electrical connections between the contacts and the circuit paths carried by the circuit board. When the assembly is completed, the circuit boards may be revolved one relative to the other so that they are positioned parallel to each other with one above the other for insertion into the computer assembly.

My hinge connector is neater and less bulky than the conventional hand-soldered connectors and thus saves valuable space in the computer. It may be easily manufactured in miniature for use with the micro-circuit boards now utilized in industry. The costs of manufacturing and assembling my hinge type connector represent a distinct saving over the costs of the hand-soldered circuit board connectors.

A modified version of my connector is provided with openings between the conductors so as to provide ventilation for the interior space between circuit boards. Such ventilation is often necessary in order to dissipate the heat generated by the components carried by the circuit boards.

Accordingly, a principal object of my invention is to provide a novel hinge type connector for circuit boards.

Another object is to provide a hinge type circuit board connector comprising a strip of flexible, nonconductive material with conductors embedded therein.

A further objective is to provide an improved mass produced hinge type connector for circuit boards wherein the conductors are embedded within a strip of flexible, nonconductive material and carry contacts at each end thereof.

Another objective is to provide an improved mass produced hinge type connector for circuit boards provided with ventilation openings therein.

Other and further objects of the invention will be apparent from the following description and claims and may be understood by reference to the accompanying drawing which by way of illustration shows preferred embodiments of the invention and what I now consider to be the best mode of applying the principles thereof. Other embodiments of the invention may be used without departing from the scope of the present invention as set forth in the appended claims.

Figures 1, 2, 3, 4, 5, 6, 7, 8:
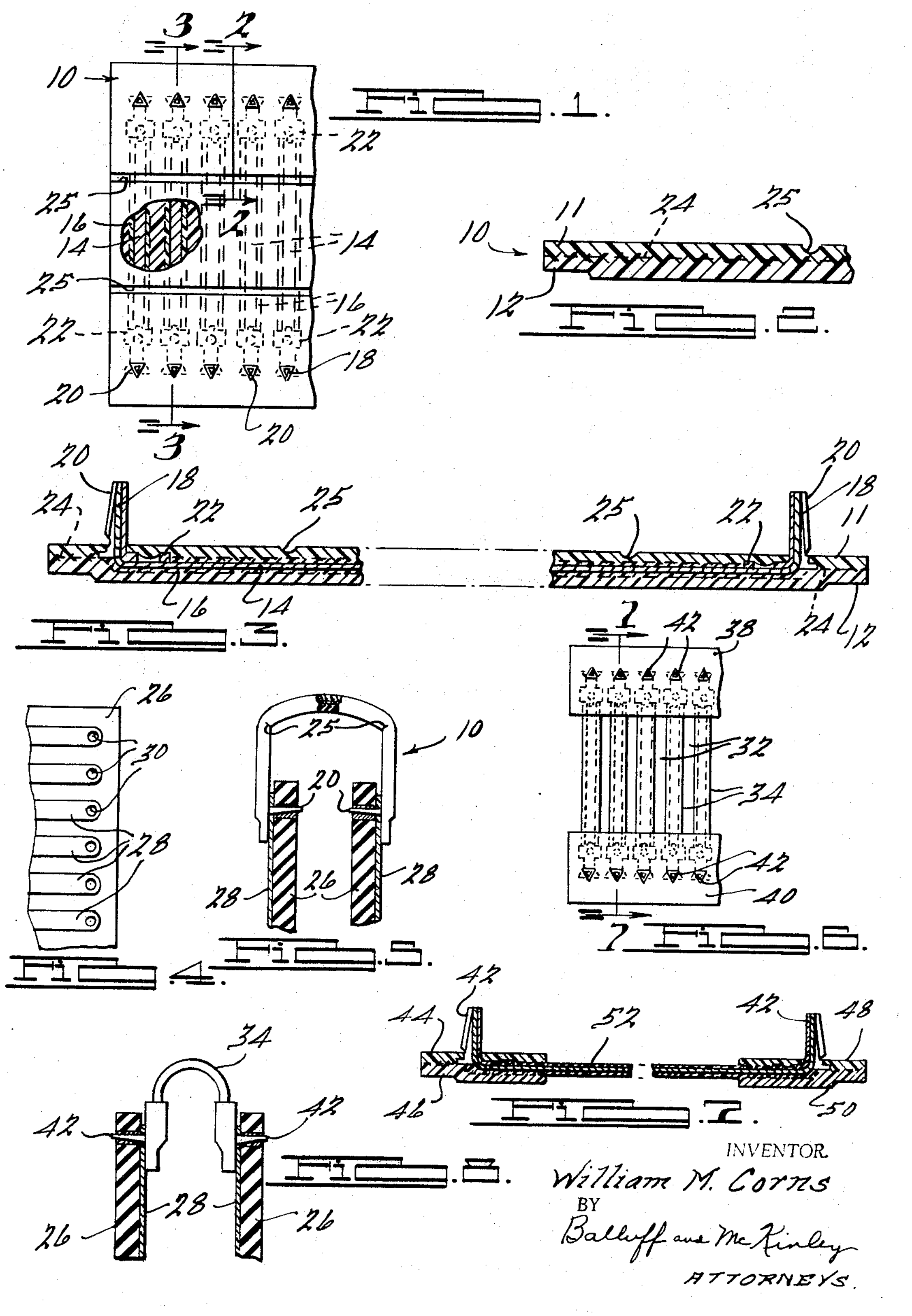
FIGURE 1 is a plan view of a circuit board connector according to my invention.
FIGURE 2 is an enlarged view taken along section 2—2 of FIGURE 1.
FIGURE 3 is an enlarged partial view taken along section 3—3 of FIGURE 1.
FIGURE 4 is a plan view of the edge of a circuit board used with my connector.
FIGURE 5 is a sectional view showing the connector joining two circuit boards.
FIGURE 6 is a plan view of a modification of my invention.
FIGURE 7 is a view similar to FIGURE 3 but taken on section 7—7 of FIGURE 6.
FIGURE 8 is a view similar to FIGURE 5, showing the modified connector of FIGURES 6 and 7.

As shown in FIGURES 1 to 5, my hinge type connector consists of a strip 10 of flexible material which is made up from two layers 11 and 12 laid one upon the other and fused together at their interface 24 as shown in FIGURE 2. A series of wires 14 carrying insulation 16 run across the width of the strip 10 at the interface 24 between the layers 11 and 12. The ends 18 of the wires 14 are crimped in a metal contact 20 which protrudes upwardly through a hole in layer 11. Contact 20 carries an ear 22 which is embedded in strip 10 between layers 11 and 12 and serves to hold the upwardly projecting portion of the contact 20 is a position generally perpendicular to the outer surface of layer 11. The series of contacts 20 carried within the strip 10 are located so that they form two rows, each row being adjacent one of the edges of the strip 10.

In making my hinge connector I have found that it is preferable that the layers 11 and 12 be made of thermoplastic material, such as polyvinyl chloride or another similar plastic. With the use of a suitable plastic for layers 11 and 12, I have found that it is possible to fuse the connector parts together in a radio frequency heat seal press so as to form the fused area 24 between the layers. I have also found that by using a wire 14 insulated by a thermoplastic insulation 16, it is possible to fuse the insulation 16 to the layers 11 and 12, thus, increasing the structural integrity of the hinge connector.

My connector is attached to circuit boards by fitting the outwardly projecting parts of the contacts 20 into holes 30 provided at one end of a circuit board 26. As shown in FIGURE 3, the portions of contacts 20 projecting from the connector are tapered so that they wedge in the hole 30 of the circuit board and make contact with circuit paths 28 carried on the circuit board and ending at the holes 30. The contacts 20 are spaced along strip 10 so as to be readily insertable into holes 30. Following insertion of one row of the contacts 20 into the holes adjacent one edge of the circuit board the connections may be solder dipped so as to achieve a permanent positive electrical connection between the circuit path 28 carried on the circuit board, the contact 20, and the wire 18 crimped within the contact 20.

It is preferable to provide my hinge connector with two grooves 25 running the length thereof which provide stress relief on the exposed surface of layer 11 so that after the circuit boards are attached to each of the rows of contacts 20 carried at the edges of the connector, it is possible to position the circuit boards as shown in FIGURE 5 with the connector being bent as shown to form a hinge type electrical connection between the circuit boards. In this position the walls of the grooves 25 are pressed together to allow the hinge type connector to bend as illustrated.

In some computers and modern electrical apparatus it is necessary to ventilate the space between the circuit boards in order to dissipate the heat generated therein by the circuit elements carried on the circuit boards. The hinge type connector shown in FIGURES 1, 2, 3 and 5 is not suitable when such ventilation must be provided.

The modified connector shown in FIGURES 6, 7 and 8 is provided with ventilation openings 32 between connecting wires 34 thereof, thus allowing the heat built up between the circuit boards to be dissipated through the openings 32. The middle portion of the connector strip is omitted to provide the ventilation spaces 32. Strips 38 and 40 are located at either side of the openings 32. Each strip 38 and 40 carries a row of contacts 42 similar to contacts 20 shown in FIGURE 3. The ends of wires 34 are crimped in contacts 42. The strips 38 and 40 are preferably likewise made of layers 44 and 46 and 48 and 50 of fused thermoplastic material. The wires 34 running between strips 38 and 40 carry a fusible plastic insulation 52 so that when the connector is formed in a heat seal press, the insulation 52 is fused to the layers 44 and 46 and 48 and 50 to form an integral one-piece connector. The two rows of contacts in the modified connector are secured to circuit boards as described previously, so that the connector forms a hinge type connection between two circuit boards as shown in FIGURE 8.

While I have illustrated and described preferred embodiments of my invention, it is understood that these are capable of modification, and I therefore do not wish to be limited to the precise details set forth but desire to avail myself of such changes and alterations as fall within the purview of the following claims.

What I claim as my invention is:

1. A hinge type connector for making electrical contact between circuit paths of two circuit boards where the edges of the circuit boards are positioned one adjacent to the other and where circuit paths end and are spaced along the edges of each board, the connector comprising a strip of non-conductive material, first and second rows of spaced metal contacts embedded within the strip adjacent opposite strip edges, said contacts including contact means extending outwardly of said strip through holes formed in one side of the non-conductive material for making an electrical connection with the circuit board circuit paths and stabilizing ears embedded within said strip to position said means generally normal to said strip and to facilitate connecting said means to the circuit boards, a series of wire conductors embedded within said strip and running between the two rows of contacts, each conductor being secured at the ends thereof to a contact in the first row and to a contact in the second row so as to provide an insulated circuit path therebetween, said strip and conductors being flexible so that said connector may be bent into a U-shape to bring said rows adjacent each other, said connector being attachable to said circuit boards so that said contact means of the first row of contacts are in electrical connection with the circuit paths ending at the edge of the first circuit board, said contact means of the second row of contacts are in electrical connection with the circuit paths ending at the edge of the second circuit board, and said strip acts as a hinge between the circuit boards to allow the circuit boards to be moved one relative to the other as the hinge is flexed without disrupting the electrical connections therebetween.

2. A connector as described in claim 1 wherein ventilation openings are provided in said strip between said conductors.

3. A connector as described in claim 1 wherein a groove generally transverse to said conductors is provided in one side of said strip to facilitate flexing of the strip with the groove on the concave side thereof.

4. A hinge type connector for making electrical contact between the circuit paths of adjacent circuits comprising a strip of flexible insulating material, a number of flexible insulated wire conductors carried by said strip with the conductor insulation and strip insulation fused together, and a contact element secured to each wire end of each conductor, each element including exposed contact means to join said connector to a circuit path and a stabilizing ear secured to said strip to orient said means in position to make contact with said circuit path whereby first contact elements make contact with the circuit paths of one circuit and second contact elements make contact with the circuit paths of the other circuit, and the connector forms a flexible hinge connection between the elements.

5. A connector according to claim 4 wherein said strip comprises two layers of thermoplastic material fused together at the common interface, said conductors and said ears lie in such interface and the insulation of each conductor is fused to both said strips.

6. A connector as described in claim 4 wherein a groove generally transverse to said conductors is provided in one side of said strip to facilitate flexing of the strip with the groove in the concave side thereof.

7. A hinge type connector for making electrical contact between circuit paths of two circuit boards where the edges of the circuit boards are positioned one adjacent to the other and where the circuit paths end and are spaced along the edges of each board, the connector comprising two strips of flexible non-conductive material, a first row of spaced, exposed, metal contacts facing outwardly from one side of one of said strips, a second row of spaced, exposed, metal contacts facing outwardly from one side of the other of said strips in the same general orientation as said first row, a series of insulated wire conductors running between said strips, the end portion of each conductor being attached to one of said strips with each wire secured to a contact in each row so as to provide an insulated circuit path therebetween, means joining said connector to said circuit boards so that the first row of contacts is in electrical contact with the circuit paths ending at the edge of the first circuit board and the second row of contacts is in electrical contact with the circuit paths ending at the edge of the second circuit board, and said connector acts as a hinge between the circuit boards to allow the boards to be revolved one relative to the other without disrupting the electrical contactst therebetween.

8. A connector as described in claim 7 wherein each contact has a stabilizing ear embedded within the respective strip and projects outwardly from one side of such strip.

9. A connector for making electrical contact between circuit paths on circuit elements, the connector comprising two strips of flexible non-conductive material, a row of spaced metal contacts carried by and extending along one of said strips, each contact including an exposed contact portion and stabilizing means for orienting said portion relative to said strip to facilitate attaching to a circuit element, a row of metal contact means carried by and extending along the other of said strips, a series of insulated wire conductors running between said strips, the wire of each wire conductor being connected at the ends thereof to one of said contacts and to one of said contact means to establish an insulated circuit path therebetween.

10. A connector as in claim 9 wherein at least part of each contact and each contact means is embedded in its respective strip.

11. A connector as in claim 9 wherein said stabilizing means comprises an ear embedded within said first strip and said contact portion comprises an elongate member projecting away from such strip through an opening therein.

12. A connector as in claim 11 wherein each of said strips comprises two layers of plastic material fused together with portions of said metal contacts and said contact means positioned between the layers of their respective strips.

13. A connector as in claim 9 wherein the ends of the insulation of said wire conductors adjacent said metal contacts are embedded within said first strip.

14. A connector as in claim 13 wherein the ends of the insulation of said wire conductors adjacent said contact means are embedded within said second strip.

15. A connector as in claim 9 wherein the ends of the insulation of said wire conductors adjacent said metal contacts are fused to said first strip.

16. A connector as in claim 15 wherein the ends of the insulation of said wire conductors adjacent said contact means are fused to said second strip.

17. A connector as in claim 9 wherein said contact portions are hollow, the ends of the wire conductors adjacent said metal contacts are bared of insulation, extend into said contact portions, and are secured therein by crimp connections.

18. A connector as in claim 9 wherein all of said metal contacts and said contact means are formed from sheet metal stock.

19. A connector for making electrical contact between circuit paths of two circuit elements where the circuit paths end and are spaced along each element, the connector comprising two strips of flexible non-conductive material, a first row of spaced metal contacts secured to one of said strips with contact portions projecting away from such strip, a second row of spaced metal contact means secured to the other of said strips, a series of insulated wire conductors running between said strips, the insulated end portion of each wire conductor adjacent said one strip being embedded therein, the wire in each conductor being secured to one of said contacts in said first row and to one of said contact means in said second row so as to provide an insulated circuit path therebetween, said contact portions of said contacts and said contact means adapted to join said connector to the circuit elements so that the first row of contacts is in electrical connection with the circuit paths of the first circuit element and the second row of contact means is in electrical connection with the circuit paths of the second circuit element, and said connector permits movement of the circuit elements one relative to the other without disturbing the electrical connections therebetween.

References Cited

UNITED STATES PATENTS

| | | | |
|---|---|---|---|
| 2,396,725 | 3/1946 | Thomas | 339—59 |
| 2,581,967 | 1/1952 | Mitchell | 339—17 |
| 2,740,097 | 3/1956 | Edelman et al. | 339—17 |
| 2,927,953 | 3/1960 | Staller | 339—112 X |
| 3,059,152 | 10/1962 | Khouri | 339—275 X |
| 3,079,458 | 2/1963 | Hedstrom | 339—17 X |
| 3,221,286 | 11/1965 | Fedde | 339—17 |

OTHER REFERENCES

Dunman, J. P. G.: IBM Technical Disclosure Bulletin, August 1964, page 182.

MARVIN A. CHAMPION, *Primary Examiner.*

P. TEITELBAUM, *Assistant Examiner.*